United States Patent
Liang et al.

(10) Patent No.: US 8,703,558 B2
(45) Date of Patent: Apr. 22, 2014

(54) GRAPHENE DEVICE AND METHOD FOR MANUFACTURING THE SAME

(75) Inventors: Qingqing Liang, Beijing (CN); Zhi Jin, Beijing (CN); Wenwu Wang, Beijing (CN); Huicai Zhong, Beijing (CN); Xinyu Liu, Beijing (CN); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/140,141

(22) PCT Filed: Feb. 24, 2011

(86) PCT No.: PCT/CN2011/000291
§ 371 (c)(1),
(2), (4) Date: Dec. 28, 2011

(87) PCT Pub. No.: WO2012/034345
PCT Pub. Date: Mar. 22, 2012

(65) Prior Publication Data
US 2012/0097923 A1 Apr. 26, 2012

(30) Foreign Application Priority Data
Sep. 17, 2010 (CN) ............................ 2010 1 0287078

(51) Int. Cl.
*H01L 21/00* (2006.01)
(52) U.S. Cl.
USPC ............ 438/158; 438/151; 257/27; 257/192; 257/243; 257/613; 977/734; 977/755

(58) Field of Classification Search
CPC ..................... H01L 29/1606; H01L 29/66015; H01L 2924/13088
USPC ............ 257/27, 192, 243, 613; 977/734, 755; 438/151, 158
See application file for complete search history.

(56) References Cited

U.S. PATENT DOCUMENTS

| 7,732,859 | B2 * | 6/2010 | Anderson et al. ............. 257/328 |
| 7,772,059 | B2 * | 8/2010 | Parikh et al. .................. 438/198 |

(Continued)

FOREIGN PATENT DOCUMENTS

| CN | 101475160 | 7/2009 |
| CN | 101475160 A | 8/2009 |

(Continued)

OTHER PUBLICATIONS

International Search Report PCT/CN2011/000291.

(Continued)

*Primary Examiner* — Jay C Kim
(74) *Attorney, Agent, or Firm* — Troutman Sanders LLP (57) ABSTRACT

The invention provides a graphene device structure and a method for manufacturing the same, the device structure comprising a graphene layer; a gate region in contact with the graphene layer; semiconductor doped regions formed in the two opposite sides of the gate region and in contact with the graphene layer, wherein the semiconductor doped regions are isolated from the gate region; a contact formed on the gate region and contacts formed on the semiconductor doped regions. The on-off ratio of the graphene device is increased through the semiconductor doped regions without increasing the band gap of the graphene material, i.e., without affecting the mobility of the material or the speed of the device, thereby increasing the applicability of the graphene material in CMOS devices.

4 Claims, 9 Drawing Sheets

(56) References Cited

U.S. PATENT DOCUMENTS

| | | | |
|---|---|---|---|
| 7,858,989 B2* | 12/2010 | Chen et al. | 257/76 |
| 8,119,032 B2* | 2/2012 | Gordon et al. | 252/502 |
| 8,124,463 B2* | 2/2012 | Chen et al. | 438/149 |
| 8,344,357 B2* | 1/2013 | Kobayashi | 257/24 |
| 2005/0212014 A1* | 9/2005 | Horibe et al. | 257/213 |
| 2009/0224230 A1* | 9/2009 | Pesetski et al. | 257/24 |
| 2009/0236609 A1 | 9/2009 | de Heer | |
| 2010/0006823 A1 | 1/2010 | Anderson et al. | |
| 2010/0025660 A1 | 2/2010 | Jain | |
| 2011/0114918 A1* | 5/2011 | Lin et al. | 257/24 |

FOREIGN PATENT DOCUMENTS

| | | |
|---|---|---|
| CN | 101783366 | 7/2010 |
| CN | 101783366 A | 7/2010 |
| CN | 101834206 | 9/2010 |
| CN | 101834206 A | 9/2010 |

OTHER PUBLICATIONS

Chinese Office Action issued for 201010287078.8.

* cited by examiner

GRAPHENE DEVICE AND METHOD FOR MANUFACTURING THE SAME

CROSS-REFERENCE TO RELATED APPLICATIONS

This application is a Section 371 National Stage Application of, and claims priority to, International Application No. PCT/CN2011/000291, filed on Feb. 24, 2011, which claimed priority to Chinese Application No. 201010287078.8, filed on Sep. 17, 2010. Both the international application and the Chinese application are incorporated herein by reference in their entireties.

FIELD OF THE INVENTION

The invention in general relates to a semiconductor device and a method for manufacturing the same, and in particular, to a graphene semiconductor device and a method for manufacturing the same.

BACKGROUND OF THE INVENTION

Currently, with respect to a prospective pilot study, what is most concerned about is whether a CMOS device still can be based on a silicon semiconductor substrate as it was after the technology generation of 11 nm to 16 nm. One research focus is to develop a new material system with higher carrier mobility and a new technical means to further extend the Moore Law and Beyond Si-CMOS and promote the development of the integrated circuit technology.

The graphene material receives an extensive attention because of its excellent physical properties, such as high carrier mobility, high electrical conductivity, and high thermal conductivity, etc., and is a kind of carbon-based material which people feel very optimistic about. Although the graphene material shows many excellent physical properties, its application in a CMOS device as a channel material with high carrier mobility is confronted with many challenges. Currently, some studies show that the on-off ratio of a graphene device may be increased to some extent by increasing the band gap of the graphene, but at the same time at the cost of the carrier mobility of the graphene or the speed of the device.

Therefore, it is desirable to propose a graphene device structure and a method for manufacturing the same which is capable of increasing the on-off ratio of a graphene device without increasing the band gap of the graphene material, thereby not affecting the speed of the device.

SUMMARY OF THE INVENTION

In view of the above problems, in the invention it is provided a graphene device structure, comprising: a graphene layer; a gate region in contact with the graphene layer; semiconductor doped regions formed in two opposite sides of the gate region and in contact with the graphene layer, wherein the semiconductor doped regions are isolated from the gate region; and a contact formed on the gate region and contacts formed on the semiconductor doped regions.

In addition, in the invention it is provided a method for manufacturing a graphene device, the method comprising: a) providing a substrate, the substrate comprising an insulating layer and a semiconductor layer on the insulating layer; b) forming a back gate region on the insulating layer and in the semiconductor layer of the substrate, the back gate region comprising a gate electrode and a gate dielectric layer on the gate electrode, the sidewalls of the gate electrode being surrounded by an isolating layer, and forming semiconductor doped regions in the semiconductor layer on opposite sides of the gate electrode; c) forming a graphene layer partially covering both the back gate region and the semiconductor doped regions; d) forming an interlayer dielectric layer on the device; and e) forming a contact in the interlayer dielectric layer and on a portion of the gate electrode not covered by the graphene layer, and forming contacts in the interlayer dielectric layer and on portions of the semiconductor doped regions not covered by the graphene layer.

Using the device structure according to the invention, semiconductor doped regions are formed in contact with the graphene layer in the two regions neighbouring the gate region on two opposite sides, through which the on-off ratio of the graphene device is increased without increasing the band gap of graphene, and thus the mobility of a graphene material, i.e., the speed of the device, will not be decreased, thereby increasing the applicability of the graphene material in CMOS devices.

DETAILED DESCRIPTION OF THE INVENTION

The invention in general relates to a graphene device and a manufacturing method thereof. The disclosure in the following provides many different embodiments or examples to implement various structure of the invention. For simplifying the disclosure of the invention, the components and arrangements of specific examples are described. Of course, they are just examples, and are not intended to limit the invention. Furthermore, the invention may repeat reference numerals and/or characters in various examples. Such a repeat is for the purpose of simplification and clarity, which is not indicative of the relationship between the various embodiments and/or arrangements under discussion. Furthermore, although the invention provides examples of various specific processes and materials, the applicability of other processes and/or the use of other materials will occur to those skilled in the art. In addition, a structure described in the following in which a first feature is "on" a second feature may not only comprise an embodiment wherein the first feature and the second feature are formed to be in direct contact, but also comprise an embodiment wherein a further feature is formed between the first and second features, so the first and second features may not be in direct contact.

Figure 1:
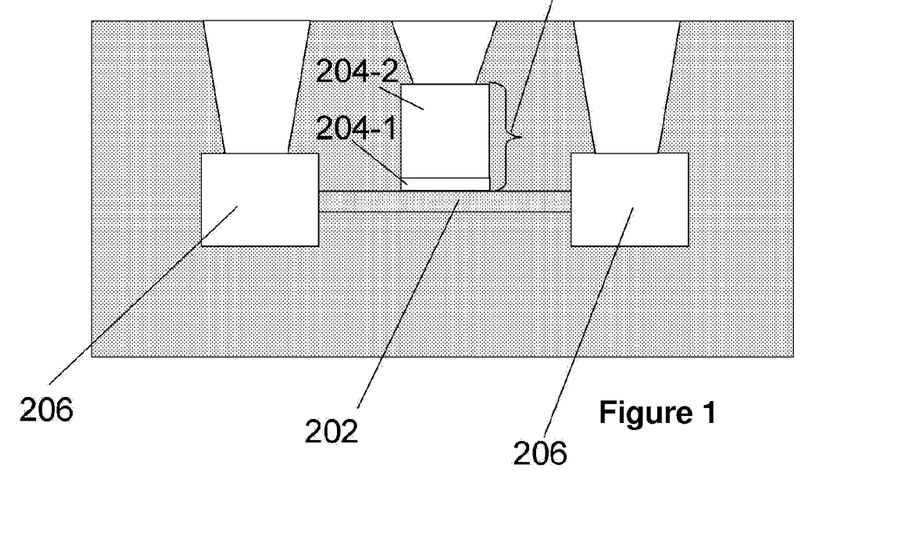
FIG. 1 shows a schematic view of a graphene device structure according to an embodiment of the invention.

Referring to FIG. 1, this figure shows a schematic view of a graphene device structure according to an embodiment of the invention. The graphene device structure comprises: a graphene layer 202, which may comprise a single layer or multiple layers of graphene atoms; a gate region 204 in contact with the graphene layer 202, which comprises a gate dielectric layer 204-1 and a gate electrode 204-2, wherein the gate dielectric layer comprises $SiO_2$, SiON, or a high-k dielectric material (having a higher dielectric constant as compared with $SiO_2$), the examples of the high-k dielectric material comprising $HfO_2$, HfSiO, HfSiON, HfTaO, HfSiO, HfZrO, $Al_2O_3$, $La_2O_3$, $ZrO_2$, LaAlO, a combination thereof and/or other suitable materials, and the gate electrode comprises polysilicon or metal material (e.g., TiN); semiconductor doped regions 206 formed in the two opposite sides of the gate region 204 and in contact with the graphene layer 202, wherein the semiconductor doped regions comprise a semiconductor material with either an n-type or p-type doping, the n-type or p-type doping being heavily doped, the semiconductor doped regions 206 are isolated from the gate region 204, and the semiconductor doped regions 206 are the source region and the drain region of the device; a contact 209 formed on the gate region 204 and contacts 209 formed on the semiconductor doped regions 206.

Figure 2:
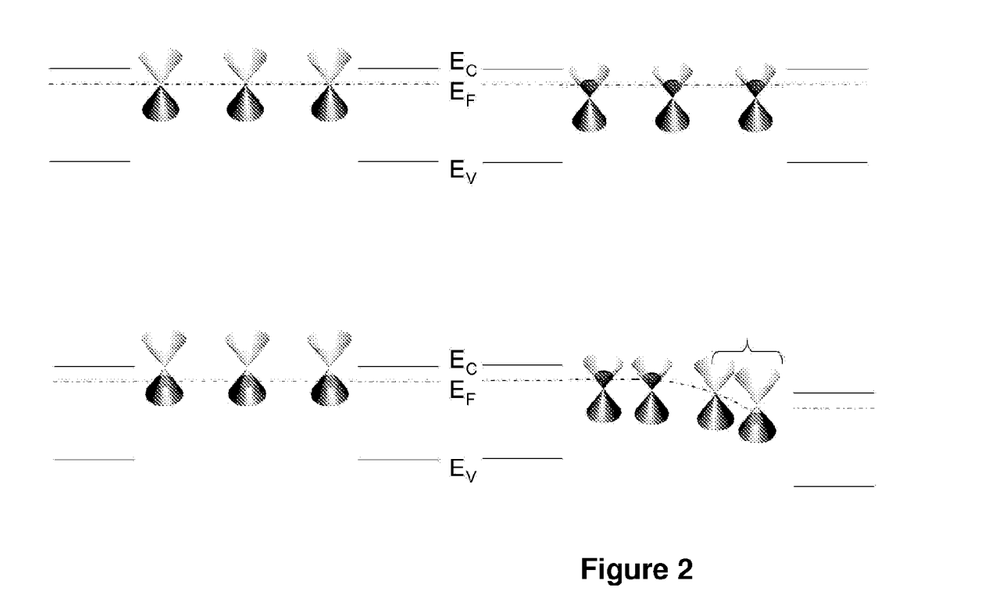
FIG. 2 shows an energy band diagram of an n-type graphene device according to an embodiment of the invention in various operation modes.
Figure 3:
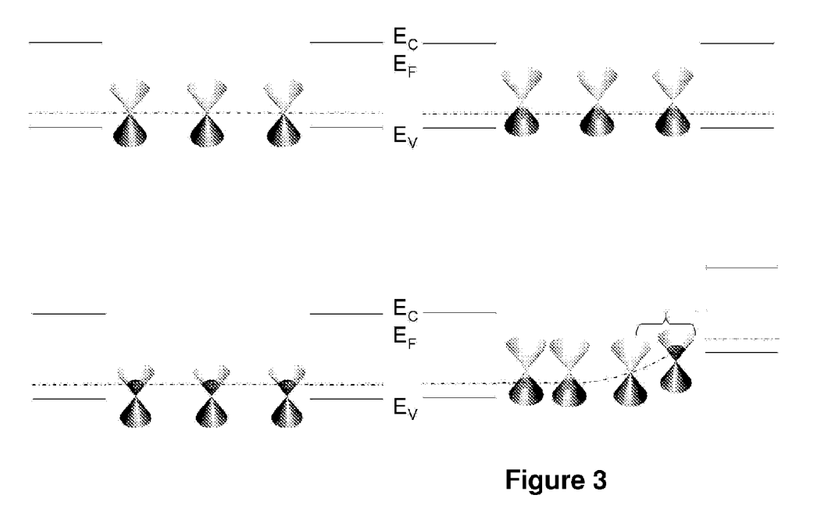
FIG. 3 shows an energy band diagram of a p-type graphene device according to an embodiment of the invention in various operation modes.

For a better understanding of the invention, in the following the energy band diagrams of the n-type and p-type graphene devices will be described in detail. Referring to FIGS. 2 and 3, the n-type graphene device means that the semiconductor doped regions are n-type doped, and the p-type graphene device means that the semiconductor doped regions are p-type doped, wherein Vgs is the gate-source voltage, Vds is the drain-source voltage, and Vthn, Vthp are the threshold voltages of the n-type device and the p-type device, respectively.

Referring to FIG. 2, this figure is an energy band diagram of an n-type graphene device in various operation modes. When the gate bias is lower than the threshold voltage (in this case, Vgs≤0), the device is in the off state. Referring to the energy band diagram for the off state shown in FIG. 2, the Fermi level in graphene is lower than the Dirac point, and thus the major carriers in graphene are holes. Since the semiconductor doped regions at both sides are of n-type, the holes in the graphene need to cross over a high barrier to be able to arrive at the source/drain region, therefore the device is off and the drain current is in exponential inverse proportion to the height of the barrier. When the gate bias is higher than the threshold voltage (Vgs>0), the Fermi level in graphene is higher than the Dirac point, the major carriers in graphene are electrons, and there is no potential barrier to the electrons between the n-type semiconductor doped region and the graphene channel, therefore the device is on, referring to the energy diagram for the linear-on or saturation-on state shown in FIG. 2. Meanwhile, since there is no limitation to the band gap of graphene in this device, a very high mobility may be achieved.

Referring to FIG. 3, this figure is an energy band diagram of a p-type graphene device in various operation modes. When the gate bias is higher than the threshold voltage (Vgs≥0), the device is in the off state. Referring to the energy band diagram for the off state shown in FIG. 3, the Fermi level in the graphene is higher than the Dirac point, and the major carriers are electrons. Since the semiconductor doped regions at both sides are of p-type, the electrons in graphene need to cross over a high barrier to be able to arrive at the source/drain region, therefore the device is off and the drain current is in exponential inverse proportion to the height of the barrier. When the gate bias is lower than the threshold voltage (Vgs<0), the Fermi level in graphene is lower than the Dirac point, the major carriers are holes, and there is no potential barrier to the holes between the p-type semiconductor doped region and the graphene channel, therefore the device is on, referring to the energy diagram for the linear-on or saturation-on state shown in FIG. 3. Meanwhile, since there is no limitation to the band gap of graphene in this device, a very high mobility may be achieved.

The graphene device according to the invention and the energy diagram thereof are described in detail in the above. Using the graphene device structure according to the invention, the on-off ratio of the graphene device is increased due to the n-type or p-type semiconductor doped regions, while the graphene carrier mobility is not affected, i.e. the speed of the device is not compromised, thereby increasing the applicability of the graphene material in CMOS devices.

In the following, an embodiment of a manufacturing method for forming the graphene device will be described in detail. In particular, reference is made to FIGS. 4-9B, which are schematic views of the intermediate steps of an embodiment of a method for manufacturing a graphene device according to the invention, and comprise top views, views in the A-A' direction, and views in the B-B' direction.

Figure 4:
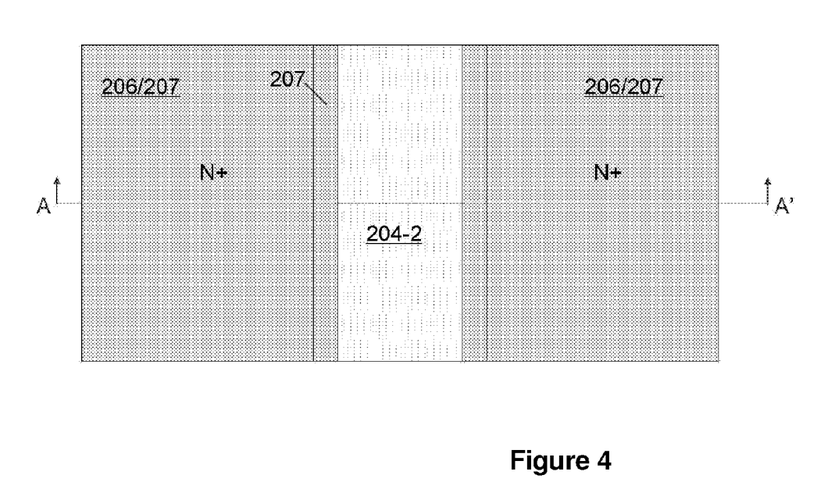
FIGS. 4, 4A, 5, 5A, 6, 6A, 7, 7A, 8, 8A, 8B, 9, 9A, and 9B show schematic views of various manufacturing stages according to an embodiment of a graphene device of the invention.
Figure 4A:
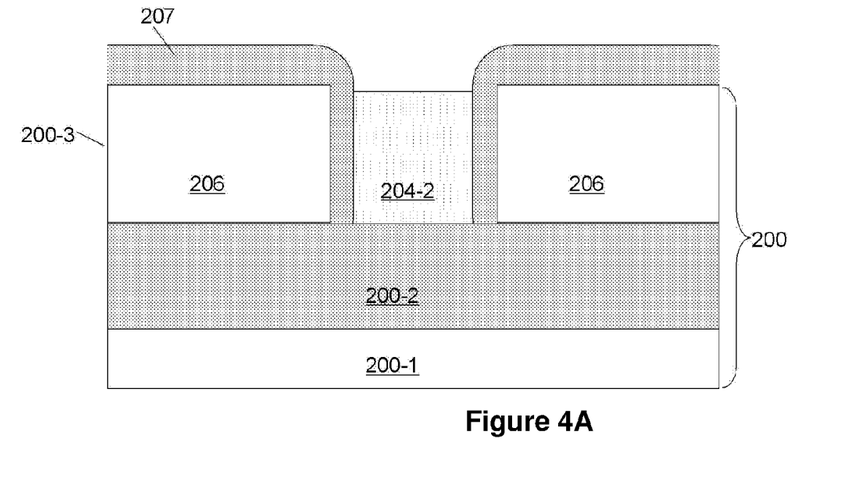
Figure 5:
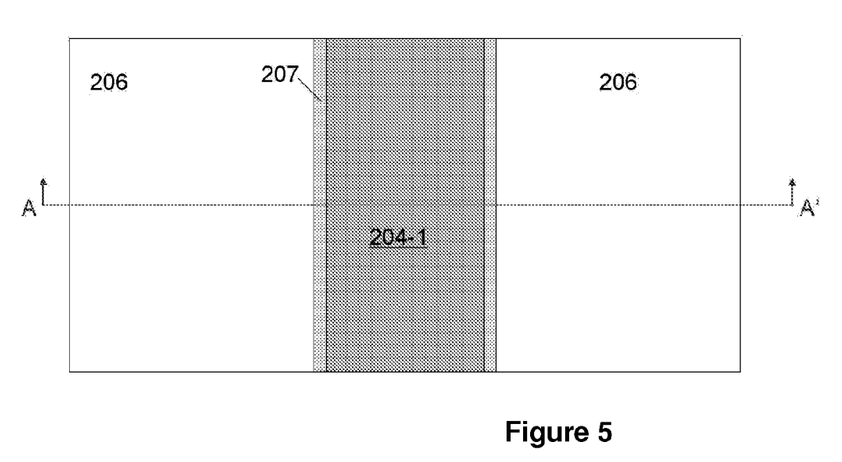
Figure 5A:
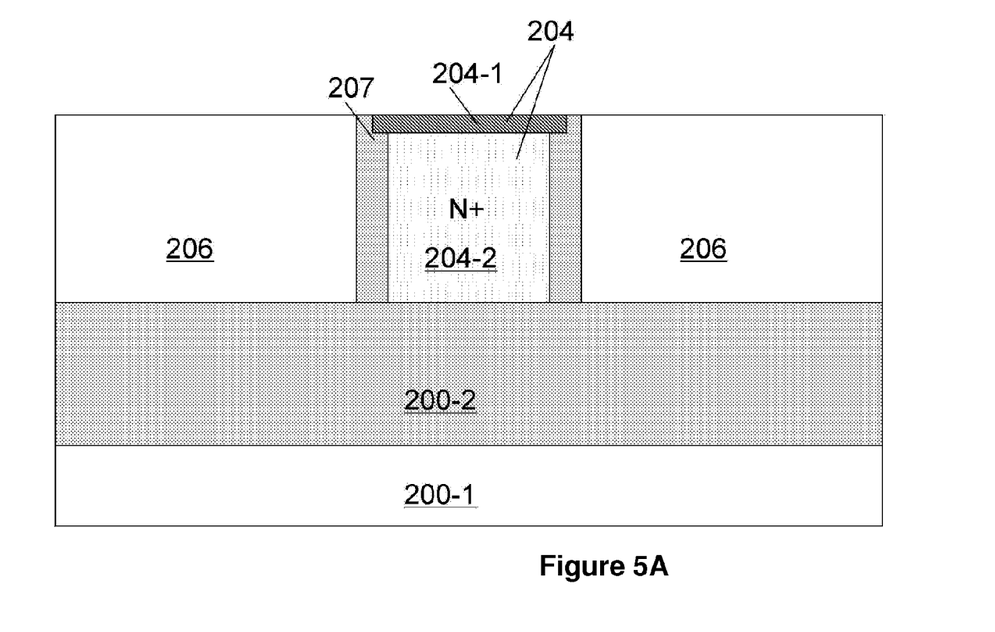
Figure 6:
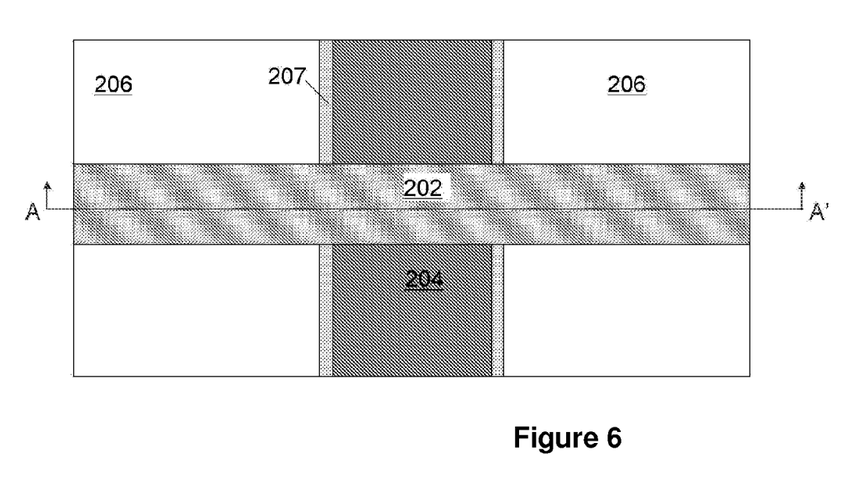
Figure 6A:
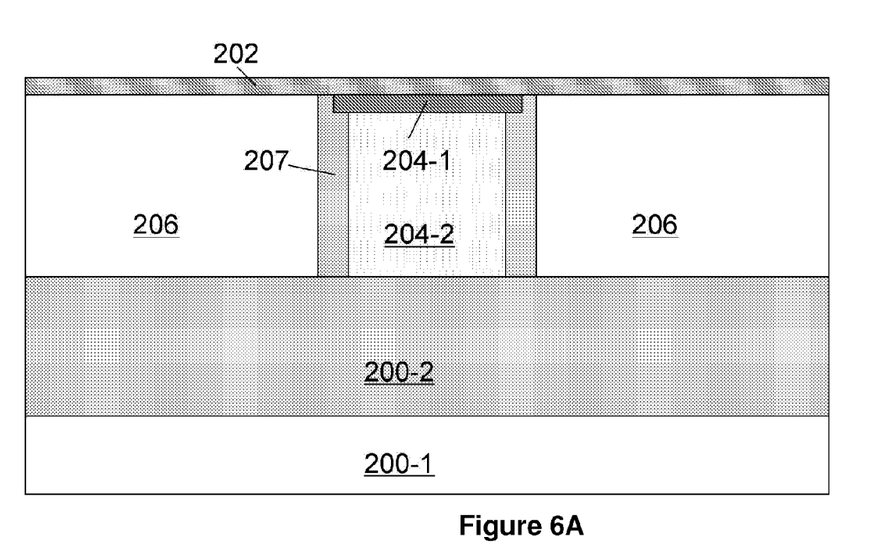

In step S01, a substrate is provided, the substrate comprising an insulating layer and a semiconductor layer thereon. In this embodiment, the substrate may be an SOI substrate 200. Referring to FIG. 4A, the SOI substrate 200 comprises a top silicon 200-3, a buried oxide layer 200-2, and a back substrate 200-1, the buried oxide layer 200-2 is the insulating layer of the substrate, and the top silicon 200-3 is the semiconductor layer of the substrate.

In step S02, a back gate region 204 comprising a gate electrode 204-2 and a gate dielectric layer 204-1 thereon is formed in the semiconductor layer 200-3 of the substrate and on the insulating layer 200-2. The sidewalls of the gate electrode 204-2 are surrounded by an isolating layer 207, and semiconductor doped regions 206 are formed in the semiconductor layer 200-3 on opposite sides of the gate electrode 204-2, referring to FIG. 5 (top view) and FIG. 5A (view in the A-A' direction).

In an embodiment of the invention, in particular, firstly, the top silicon 200-3 is etched to form a gate trench, and a heavy ion doping is performed to form semiconductor doped regions 206 in the top silicon 200-3 on opposite sides of the gate trench. Then, an isolating layer 207, such as $SiO_2$ or $Si_3N_4$, etc., is formed on sidewalls of the gate trench. Then, a gate electrode 204-2 is formed in the gate trench. In an embodiment of the invention, the gate electrode 204-2 comprises polysilicon, whereas in other embodiments the gate electrode 204-2 may further comprise a suitable material such as a metal, etc. The gate electrode 204-2 may be formed in the gate trench by depositing polysilicon on the device, and then performing a planarization, e.g. a CMP method. Optionally, a doping of the same type as the semiconductor doped regions may be formed in the gate electrode of the polysilicon, referring to FIG. 4 (top view) and FIG. 4A (view in the A-A' direction). Then, the isolating layer 207 on the semiconductor doped regions 206 is further removed, and a gate dielectric layer 204-1 is formed on the gate electrode 204-2, thereby forming a back gate region 204, referring to FIG. 5 (top view) and FIG. 5A (view in the A-A' direction). The gate dielectric layer comprises $SiO_2$, SiON, or a high-k dielectric material (having a higher dielectric constant as compared to $SiO_2$).

In step S03, a graphene layer 202 is formed to partially cover the back gate region 204 and the semiconductor doped regions 206. The graphene layer is formed on the device and patterned, thereby forming a graphene layer partially covering the back gate region 204 and the semiconductor doped regions 206 in the gate length direction, referring to FIG. 6 (top view) and FIG. 6A (view in the A-A' direction). A single layer or multiple layers of graphene material may be formed by CVD, a thermal decomposition, a micromechanical stripping, a bonding transferring, or other suitable methods.

Figure 7:
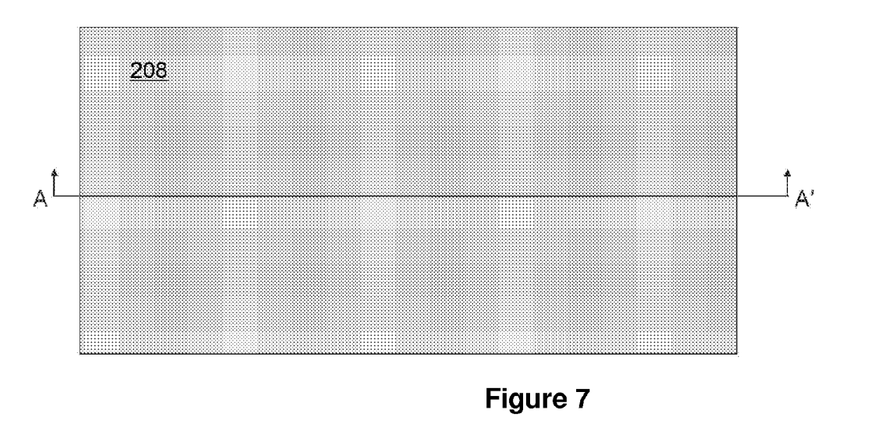
Figure 7A:
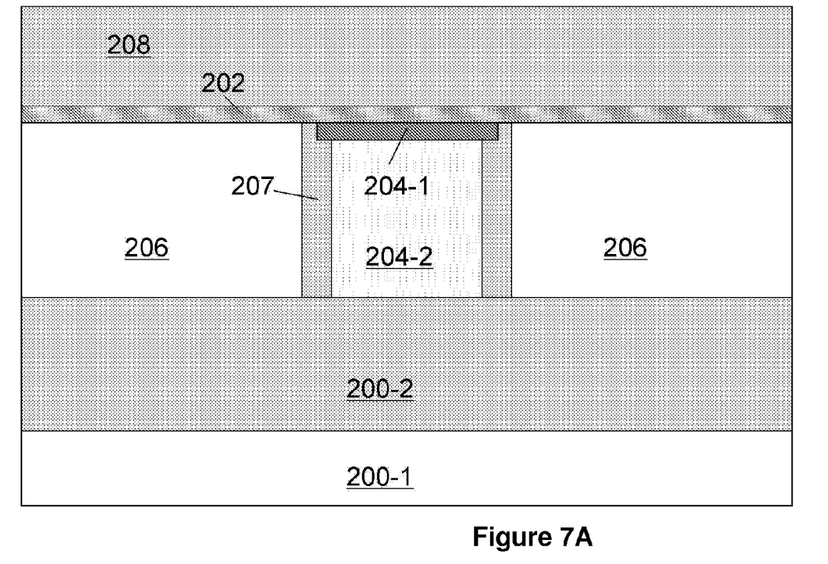
Figure 8:
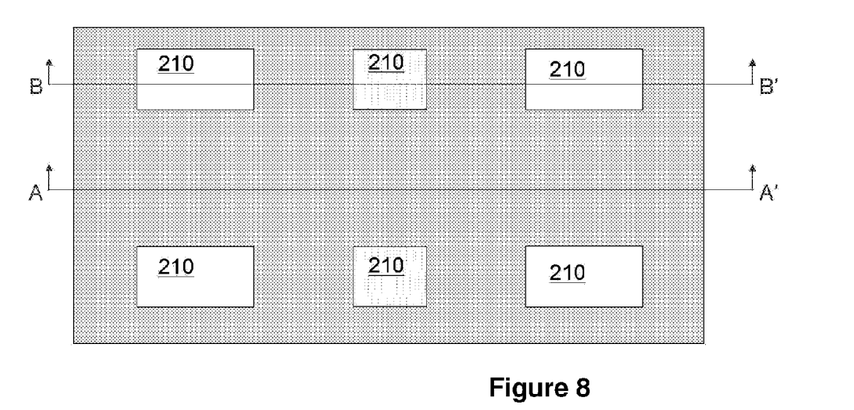
Figure 8A:
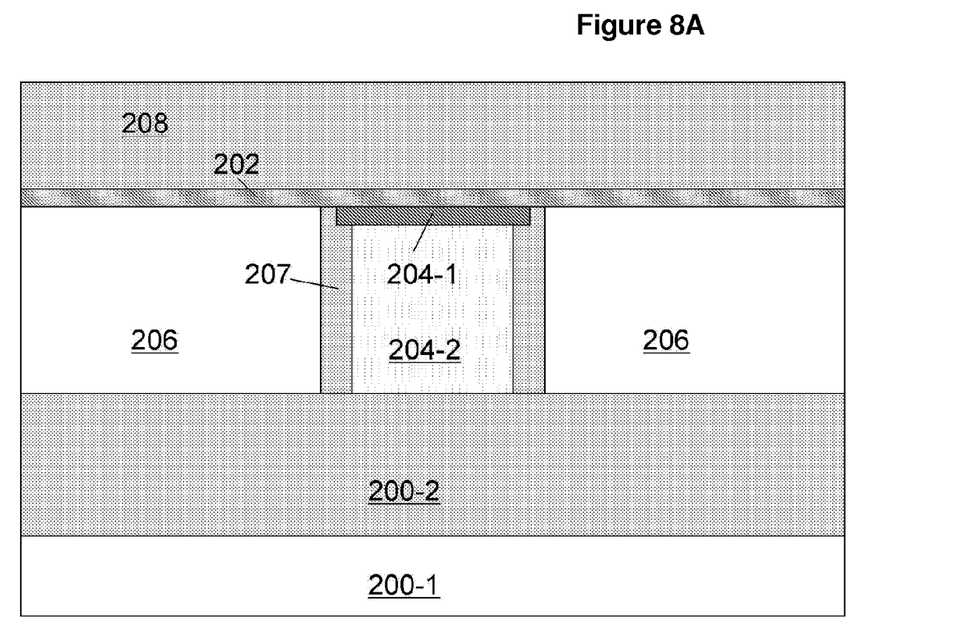
Figure 8B:
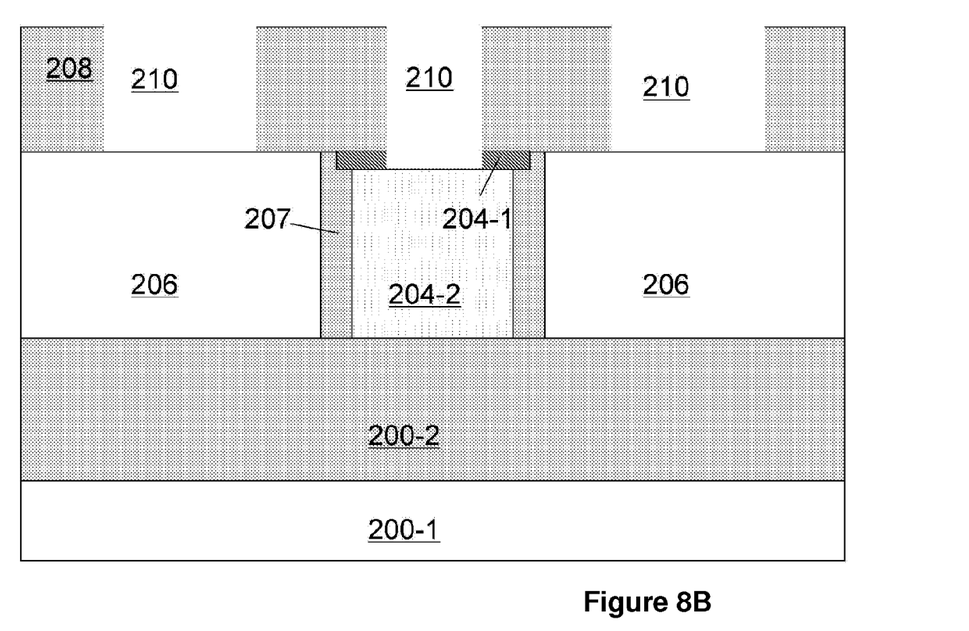

In step S04, an interlayer dielectric layer 208 is formed on the device, referring to FIG. 7 (top view) and FIG. 7A (view in the A-A' direction). The interlayer dielectric layer 208 may be formed by depositing on the device a dielectric material, e.g. $SiO_2$, and then planarizing it by, for example, CMP (chemical mechanical polishing). The interlayer dielectric layer 208 may be, but not limited to, undoped silicon oxide ($SiO_2$), doped silicon oxide (e.g., borosilicate glass, boron-phosphorous silicate glass, etc.), and silicon nitride ($Si_3N_4$), for example.

Figure 9:
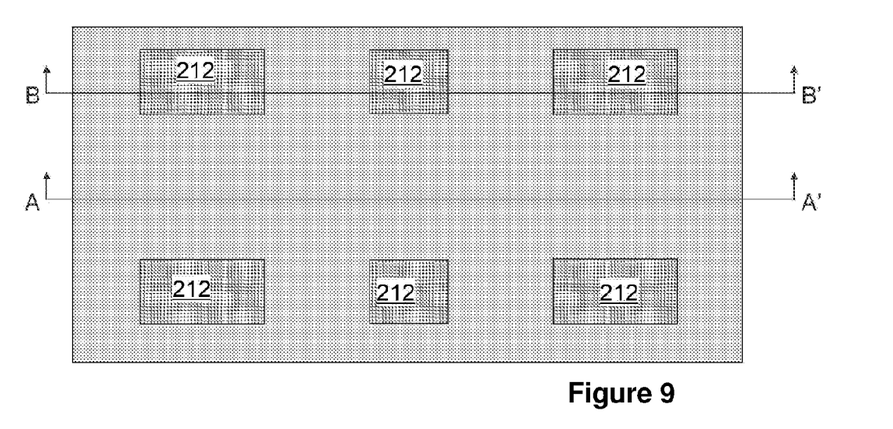
Figure 9A:
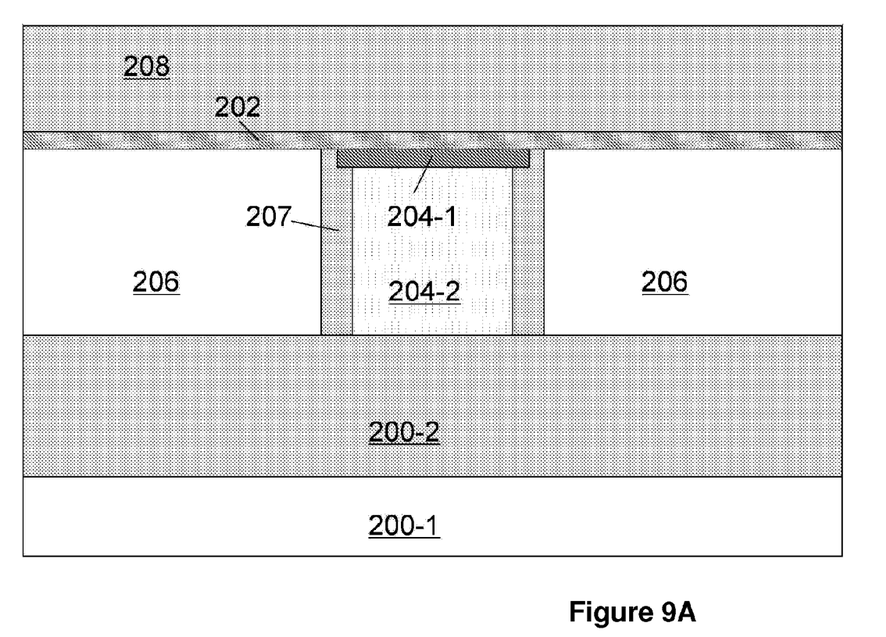
Figure 9B:
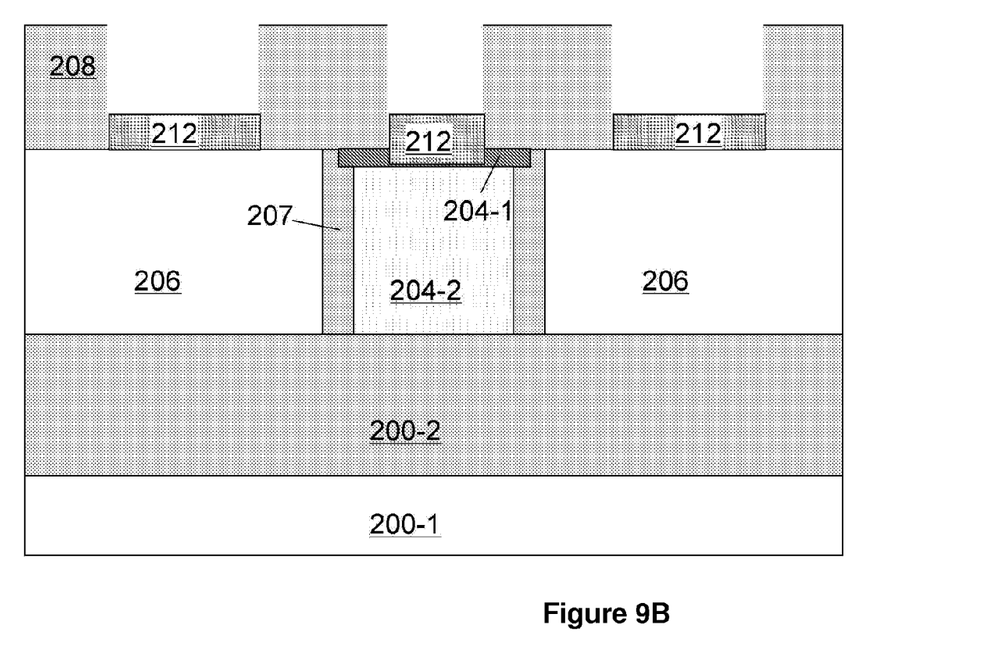

In step S05, a contact 212 is formed in the interlayer dielectric layer 208 and on a portion of the gate electrode 204-2 not covered by the graphene layer 206, and contacts 212 are formed in the interlayer dielectric layer 208 and on portions of the semiconductor doped regions 206 not covered by the graphene layer 202, referring to FIG. 9 (top view), FIG. 9A (view in the A-A' direction) and FIG. 9B (view in the B-B' direction). In an embodiment of the invention, in particular, firstly, the interlayer dielectric layer 208 and the gate dielectric layer 204-1 are etched by using a mask, thereby exposing the gate electrode 204-2 and the semiconductor doped regions 206 to form a contact hole 210, referring to FIG. 8 (top view) and FIG. 8B (view in the B-B' direction), wherein FIG. 8A (view in the A-A' direction) is a schematic view of a portion of the device in which the graphene layer is included in this step. Then, the contact 210 is filled with a metal material such as W, Cu, etc., to form a contact 212, referring to FIG. 9 (top view) and FIG. 9B (view in the BB' direction), wherein FIG. 9A (view in the A-A' direction) is a schematic view of a portion of the device in which the graphene layer is included in this step. Preferably, before forming a contact 212, the semiconductor doped layer 206 and the polysilicon gate electrode 204-2 may be metal silicified to form a metal silicide layer to lower the contact resistance.

The above is just an embodiment implementing the graphene device structure according to the invention. The manufacturing method is just exemplary, and the graphene device structure according to the invention may be formed using other methods by those skilled in the art.

An embodiment of a graphene device structure according to the invention and a method for manufacturing the same are described in detail in the above. The on-off ratio of the graphene device is increased without increasing the band gap of the graphene material by forming an n-type or p-type semiconductor doped layer in contact with the graphene layer, thus the carrier mobility in the graphene device is not affected, and hence the speed of the device is not compromised, thereby making the graphene material to be better applied in CMOS devices.

While an exemplary embodiment and the advantages thereof have been illustrated in detail, it is to be understood that various variations, alternatives and modifications may be made without departing from the spirit of the invention and the protective scope defined by the accompanied claims. For other examples, it is to be readily understood by those skilled in the art that the order of the process steps may be varied while keeping the protective scope of the invention.

Furthermore, the application of the invention is not limited to the process, mechanism, manufacture, substance composition, means, method and step of a specific embodiment described in the description. From the disclosure of the invention, it will be readily understood by those skilled in the art that, for a process, mechanism, manufacture, substance composition, means, method or step already existing currently or to be developed, in which nearly the same function as a corresponding embodiment described in the invention is implemented or nearly the same result is attained, they may be applied according to the invention. Therefore, the accompanied claims of the invention are intended to encompass the process, mechanism, manufacture, substance composition, means, method or step into the protective scope thereof.

What is claimed is:

1. A method for manufacturing a graphene device, the method comprising:
    a) providing a substrate, the substrate comprising an insulating layer and a semiconductor layer on the insulating layer;
    b) forming a back gate region on the insulating layer and in the semiconductor layer of the substrate, the back gate region comprising a gate electrode and a gate dielectric layer on the gate electrode, sidewalls of the gate electrode being surrounded by an isolating layer, and forming semiconductor doped regions in the semiconductor layer on opposite sides of the gate electrode;
    c) forming a graphene layer partially covering both the back gate region and the semiconductor doped regions;
    d) forming an interlayer dielectric layer; and
    e) forming a contact in the interlayer dielectric layer and on a portion of the gate electrode not covered by the graphene layer, and forming contacts in the interlayer dielectric layer and on portions of the semiconductor doped regions not covered by the graphene layer, wherein the substrate is an SOI substrate, and the SOI substrate comprises a top silicon, a buried oxide layer, and a back substrate; and the step b) comprises:
    etching the top silicon to form a gate trench;
    forming the semiconductor doped regions in the top silicon on opposite sides of the gate trench;
    forming the isolating layer on sidewalls of the gate trench, and forming in the gate trench the back gate region comprising the gate electrode and the gate dielectric layer on the gate electrode.

2. The method according to claim 1, wherein the semiconductor doped regions are heavily doped.

3. The method according to claim 1, wherein the semiconductor doped regions comprise either an n-type or p-type doping.

4. The method according to claim 1, wherein the gate electrode comprises polysilicon or a metal material.

* * * * *